United States Patent [19]
Yamada

[11] Patent Number: 5,511,089
[45] Date of Patent: Apr. 23, 1996

[54] SEMICONDUCTOR LASER ELEMENT WITH EXCELLENT HIGH-TEMPERATURE CHARACTERISTIC AND CAPABLE OF BEING READILY MOUNTED ON AN OPTICAL CIRCUIT BOARD

[75] Inventor: Hirohito Yamada, Tokyo, Japan

[73] Assignee: NEC Corporation, Tokyo, Japan

[21] Appl. No.: 291,498

[22] Filed: Aug. 17, 1994

Related U.S. Application Data

[63] Continuation of Ser. No. 9,944, Jan. 27, 1993, abandoned.

[30] Foreign Application Priority Data

| Jan. 27, 1992 | [JP] | Japan | 4-011485 |
| Mar. 12, 1992 | [JP] | Japan | 4-053887 |
| May 6, 1992 | [JP] | Japan | 4-113284 |

[51] Int. Cl.⁶ .................. H01S 3/19; G02B 6/30
[52] U.S. Cl. .................. 372/45; 372/49; 385/49; 385/88
[58] Field of Search ............... 372/43, 45, 49, 372/46; 385/49, 88

[56] References Cited

U.S. PATENT DOCUMENTS

| 4,466,696 | 8/1984 | Carney | 385/49 |
| 4,525,841 | 6/1985 | Kitamura et al. | 372/46 X |
| 4,589,116 | 5/1986 | Westermeier | 372/36 |
| 4,592,059 | 5/1986 | Westermeier | 372/36 |
| 4,599,728 | 7/1986 | Alavi et al. | 372/45 |
| 4,784,454 | 11/1988 | Dyott | 385/49 |
| 4,839,901 | 6/1989 | Mozer et al. | 372/49 |
| 4,904,036 | 2/1990 | Blonder | 385/49 X |
| 5,073,003 | 12/1991 | Clark | 385/88 X |
| 5,163,108 | 11/1992 | Armiento et al. | 385/49 X |
| 5,181,214 | 1/1993 | Berger et al. | 372/22 X |
| 5,208,821 | 5/1993 | Berger et al. | 372/46 X |
| 5,381,434 | 1/1995 | Bhat et al. | 372/45 |

FOREIGN PATENT DOCUMENTS

| WO9113378 | 9/1991 | France | 385/49 |

OTHER PUBLICATIONS

"Self–Aligning Edge Emitter for Fiber Optics" Balliet et al, IBM Technical Disclosure Bulletin, vol. 23 No. 7B, Dec. 1980.
IEEE Journal of Quantum Electronics, vol. 24, No. 4, Apr. 1988, pp. 635–640, A. Kurobe et al, "Effects of well number, cavity length and facet reflectivity on the reduction of threshold current of AlGaAs/GaAs multiquantum wells".
IEEE Journal of Quantum Electronics, vol. QE–18, No. 7, Jul. 1982, pp. 1101–1113, T–P Lee et al, "Short–cavity InGaAsP injection lasers: Dependence of mode spectra and single–Longitudinal—mode power on cavity length".
NEC Research and Development, vol. 33, pp. 354–364, H. Yamada et al, "Extremely low operating current lambda=1.3 mum multiple quantum well laser diodes"; Jul., 1992.

Primary Examiner—Rodney B. Bovernick
Assistant Examiner—Hemang Sanghavi
Attorney, Agent, or Firm—Sughrue, Mion, Zinn, Macpeak & Seas

[57] ABSTRACT

In a semiconductor laser element which has a semiconductor block including a first end surface, a second end surface opposite to the first end surface, and a principal surface contiguous to the first and the second end surfaces, the internal end surface is defined by forming a groove from the principal surface, creating an internal end surface opposite to the second end surface and nearer to the second end surface than the first end surface is. The internal end surface serves as a front laser beam emitting surface while the second end surface serves as a rear laser beam emitting surface. Thus, an optical resonator is provided between the internal and the second end surfaces. The internal end surface is spaced apart from the second end surface by a length of 150 μm, which is different from a length of the semiconductor block.

14 Claims, 6 Drawing Sheets

SEMICONDUCTOR LASER ELEMENT WITH EXCELLENT HIGH-TEMPERATURE CHARACTERISTIC AND CAPABLE OF BEING READILY MOUNTED ON AN OPTICAL CIRCUIT BOARD

This is a Continuation of application Ser. No. 08/009,944 filed Jan. 27, 1993 now abandoned.

BACKGROUND OF THE INVENTION

This invention relates to a semiconductor laser element.

Recently, semiconductor laser elements have been widely used in fields relating to optical communication systems such as Local Area Networks (LAN) or Cable Television (CATV). For example, the semiconductor laser element is incorporated into a small-sized optical module and is used as a light source in the optical communication system.

A conventional semiconductor laser element of the type described comprises a semiconductor block which has a first end surface, a second end surface, and a principal surface. The second end surface is opposite to the first end surface while the principal surface is contiguous to the first and the second end surfaces. The first and the second end surfaces serve as a laser beam emitting surface, respectively. With this structure, an optical resonator is provided between the first and the second end surfaces. In the conventional semiconductor laser element, the semiconductor block is about 300 μm long. This means that the optical resonator should have the same length as the semiconductor block.

In order to manufacture the above-mentioned optical module, the semiconductor laser element is mounted and supported on an optical circuit board or a heat sink and is optically connected to an optical fiber or waveguide.

In such an assembly process, a large difficulty often arises in coupling an optical axis of the optical fiber or waveguide with the laser beam emitting surface. In other words, it is difficult for the semiconductor laser element to be readily mounted on the optical circuit board or the heat sink and be optically connected to the optical fiber or waveguide precisely. As the result, a yield in the assembly process is inevitably not so good.

Further, the conventional semiconductor laser element is usually poor at high-temperature operation. Specifically, it cannot operate with a low driving current in a high-temperature condition. Accordingly, a complicated electric circuit is necessary to control the driving current in the high-temperature condition.

SUMMARY OF THE INVENTION

It is therefore an object of this invention to provide a semiconductor laser element which can be readily mounted on an optical circuit board or a heat sink and be optically connected to an optical fiber or waveguide precisely.

It is another object of this invention to provide a semiconductor laser element of the type described, which has an excellent high temperature characteristic.

According to one aspect of this invention, an improved semiconductor laser element is provided. It comprises a semiconductor block which includes a first end surface, a second end surface opposite to the first end surface, and a principal end surface contiguous to the first and the second end surfaces, wherein the semiconductor block further includes an internal end surface opposite to the second end surface and nearer to the second end surface than the first end surface, formed by a groove in the principal surface, to provide a laser beam emitting surface within the internal end surface and an optical resonator between the internal and the second end surfaces. An end portion of an optical fiber or waveguide is fitted into the groove to be optically connected to the laser beam emitting surface.

The internal end surface may be remote from the second end surface by a predetermined distance shorter than 150 μm.

According to another aspect of this invention, another semiconductor laser element is provided. It comprises a semiconductor block and a plurality of coating layers. The semiconductor block includes a first end surface, a second end surface opposite to the first end surface, and a principal end surface contiguous to the first and the second end surfaces, wherein the second end surface is remote from the first end surface by a predetermined distance shorter than 150 μm to provide an optical resonator therebetween. The plurality of coating layers are coated on the second end surface to provide a reflectivity not lower than 90%.

DESCRIPTION OF THE PREFERRED EMBODIMENTS

Figure 1:
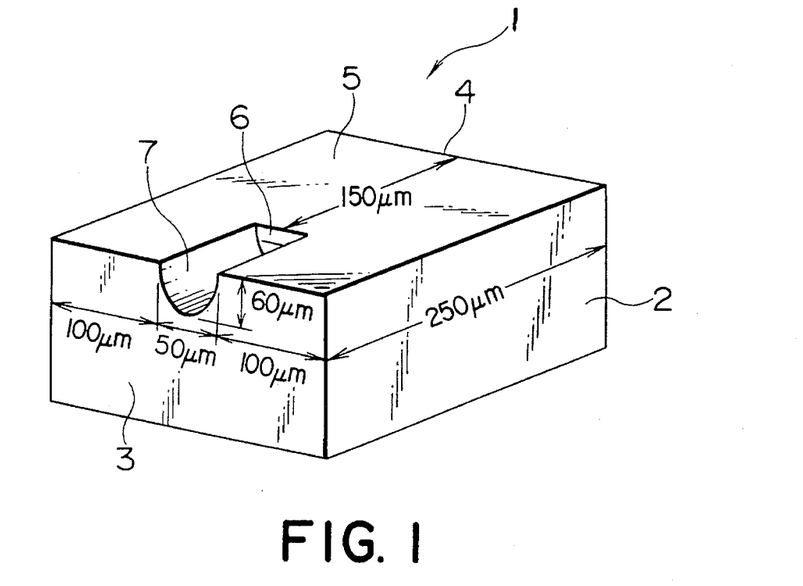
FIG. 1 is a perspective view of a semiconductor laser element according to a first embodiment of this invention.

Referring to FIG. 1, the semiconductor laser element 1 comprises a semiconductor block 2 which has a first end surface 3, a second end surface 4, a principal surface 5, and an internal end surface 6. The second end surface 4 is opposite to the first end surface 3 and serves as one laser beam emitting surface. The principal end surface 5 is contiguous to the first end surface 3 and the second end surface 4. The internal end surface 6 is defined by forming a groove 7 from the principal surface 5, creating an internal end surface opposite to the second end surface 4 and nearer to the second end surface 4 than the first end surface 3 is. The internal end surface 6 serves as another laser beam emitting surface. Thus, an optical resonator is provided between the second end surface 4 and the internal end surface 6.

In the semiconductor block 2, the first end surface 3 is remote from the second end surface 4 by a distance of 250 µm. In other words, the semiconductor block 2 has a length of 250 µm between the first and the second end surfaces 3 and 4. The principal surface 5 has a width of 250 µm along a direction orthogonal to a length direction.

On the other hand, the internal end surface 6 is remote from the second end surface 4 by a predetermined distance of 150 µm. The optical resonator therefore has a length of 150 µm which is not the same as that of the semiconductor block 2.

A plurality of coating layers are coated on the second end surface 4 to provide a reflectivity not lower than 70%.

Now, a method of manufacturing the semiconductor laser element illustrated in FIG. 1 will be described.

This semiconductor laser element may be an InGaAsP/ InP laser element. In order to manufacture this element, a double hetero (DH) wafer for lasers is at first fabricated by metal organic vapor phase epitaxy (MOVPE). Several kinds of InP and InGaAsP layers are grown on the double hetero wafer by liquid phase epitaxy (LPE) to form a double-channel planar buried hetero (DC-PBH) structure. As a result, the double hetero wafer is buried in the DC-PBH structure.

Second, an electrode layer is evaporated on one surface of the DC-PBH wafer that may be referred to as a P-side surface. A resist mask is coated on the electrode layer and a predetermined pattern of a mask is then formed on the resist to selectively etch the electrode layer and to thereby form a P-side electrode which has the predetermined pattern.

Third, a groove 7 is formed along the length direction of the semiconductor block 2 from the principal surface 5 by wet etching to provide the internal end surface 6 which serves as the laser beam emitting surface, as mentioned above. In this embodiment, the groove 7 has a semi-circular configuration in its cross section and also has a maximum depth of 60 µm and a maximum width of 100 µm. The internal end surface corresponds to an end portion of an optical fiber that will later be described.

Fourth, the other side of the DC-PBH wafer which may be called an N-side is polished to a thickness of about 150 µm. Then, another electrode is also formed on the side directed downwards of FIG. 1 like the P-side electrode.

Finally, the DC-PBH wafer is cloven at a portion spaced apart from the first end surface 3 by 250 µm. As a result, the internal end surface 6 is remote from the second end surface 4 by the distance of approximately 150 µm. This means that the optical resonator provided between the internal end surface and the second end surface comes to be about 150 µm long. The coating layers consisting of seven layers are coated on the second end surface 4 to provide a reflectivity not lower than 70%. Each layer is composed of either $SiO_2$ or Si and has a thickness of $\lambda/4n$ (n is a reflective index of the material) where $\lambda$ is a wavelength generated by the semiconductor laser element. Thereafter, the wafer is scribed or cut along the width direction into a plurality of the semiconductor laser elements 1.

Figure 2:
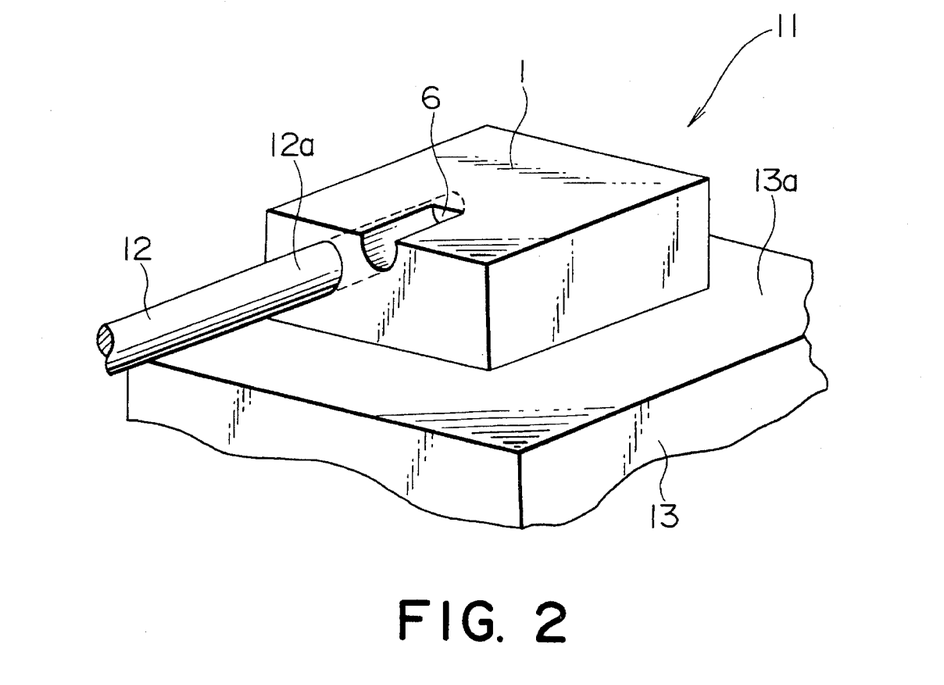
FIG. 2 is a perspective view for use in describing a method for mounting the semiconductor laser element illustrated in FIG. 1 on a heat sink to be optically connected to an optical fiber.

Referring to FIG. 2, a semiconductor laser device 11 comprises the semiconductor laser element 1 illustrated in FIG. 1 and further comprises an optical fiber 12 which has an end portion 12a and a heat sink 13 of Si which has a heat sink surface 13a. The end portion 12a is fitted into the groove 7 to be optically connected to the laser beam emitting surface which is defined by the internal end surface 6.

In order to form the semiconductor laser device 11, the semiconductor laser element 1 is at first mounted on the heat sink surface 13a. The semiconductor laser element 1 is optically connected to the optical fiber 12 by inserting the end portion 12a into the groove 7, as illustrated with dotted lines in FIG. 2.

Thus, the semiconductor laser device 11 is formed by optically coupling each semiconductor laser element 1 to the optical fiber 12 and by mounting it on the heat sink surface 13a. Under circumstances as described, characteristics of each of the semiconductor laser elements 1 were investigated and estimated. Consequently, it has been found out that about 80% of the semiconductor laser elements 1 preferably generate a laser beam of a predetermined wavelength. Accordingly, a yield in the mounting process reaches up to 80% and is considerably improved.

In a temperature of 85° C., the laser beam was measured to have a light output power of 3 mW on supplying a driving current of 40 mA with each semiconductor laser element 1. This shows that a high temperature characteristic is improved in each semiconductor laser element 1.

Figure 3:
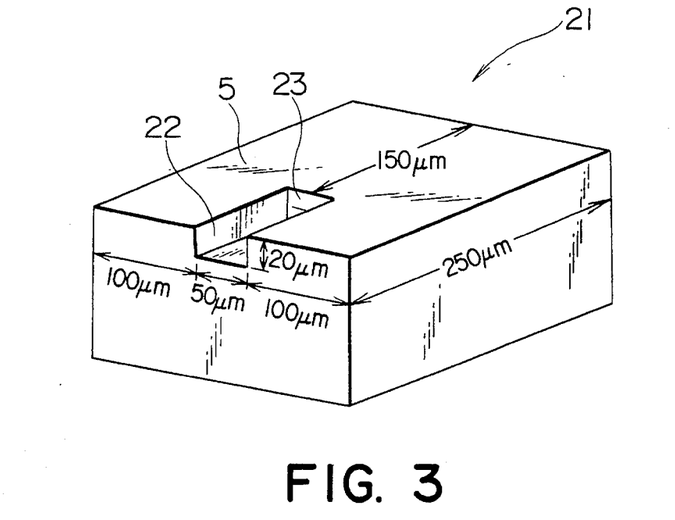
FIG. 3 is a perspective view of a semiconductor laser element according to a second embodiment of this invention.

Referring to FIG. 3, a semiconductor laser element according to a second embodiment of this invention is illustrated. In FIG. 3, the semiconductor laser element 21 comprises a groove 22 which has a rectangular configuration in its cross section and a depth of 20 µm and which corresponds to an end portion of an optical waveguide that will later be described.

In the example being illustrated, the groove 22 is formed from the principal surface 5 by dry etching to provide an internal end surface 23, an internal bottom surface, and a pair of internal side surfaces contiguous to the internal end surface 23, the internal bottom surface, and the internal side surfaces. Alternatively, the groove 7 may be formed by wet etching in lieu of the dry etching, as previously described. Except for such a method for etching, the semiconductor laser element 21 is manufactured by the same methods as those used for manufacturing the semiconductor laser element 1 illustrated in FIG. 1.

Figure 4:
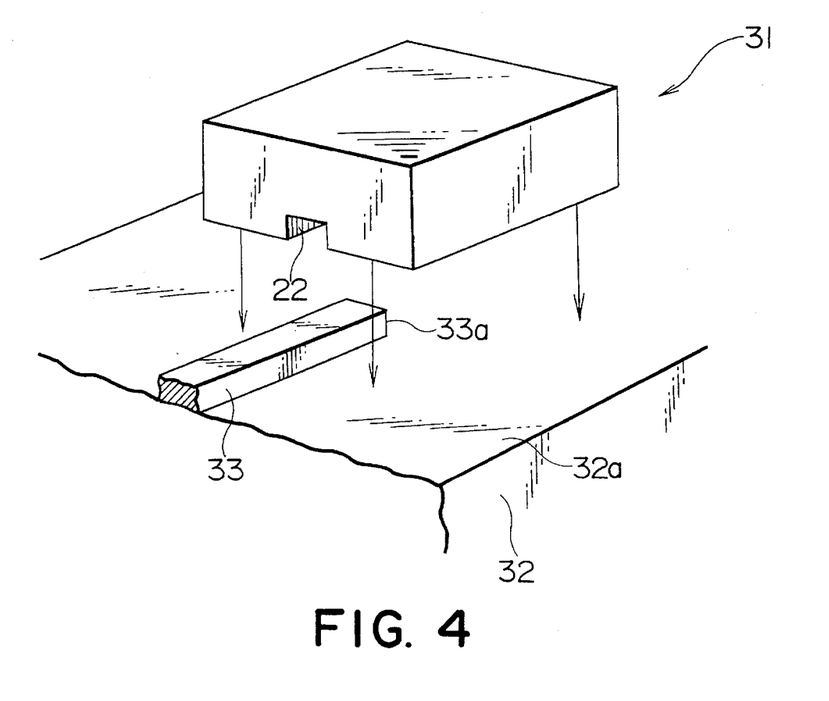
FIG. 4 is a perspective view for use in describing a method for mounting the semiconductor laser element illustrated in FIG. 3 on a circuit board to be optically connected to an optical waveguide.

Referring to FIG. 4, a semiconductor laser device 31 comprises the semiconductor laser element 1 oriented upside down relative to FIG. 3 and further comprises a circuit board 32 of Si which has a board surface 32a, an optical waveguide 33 which has an end portion 33a and which is formed on the board surface 32a. The end portion 33a is fitted into the groove 22 to be optically coupled to the laser beam emitting surface which is defined by the internal end surface 23.

In order to form the semiconductor laser device 31, the semiconductor laser element 21 is at first mounted on the board surface 33a with the groove 22 directed downwards of FIG. 4. The semiconductor laser element 21 is optically coupled to the optical waveguide 33 by fitting the end portion 33a into the groove 22, as illustrated with arrows in FIG. 4.

After the semiconductor laser device 31 is formed by optically coupling each semiconductor laser element 21 to the optical waveguide 33, like in the first embodiment, characteristics of each of the semiconductor laser elements 21 were investigated and estimated. Consequently, it has been found out that about 70% of the semiconductor laser elements 21 preferably generate a laser beam of a predetermined wavelength. Accordingly, a yield in the mounting process of up to 70% can be attained and is considerably improved in this embodiment.

In a temperature of 85° C., the laser beam had a light output power of 2 mW on supplying a driving current of 40 mA with each semiconductor laser element 21. This shows that a high temperature characteristic is improved in each semiconductor laser element 21.

Figure 5:
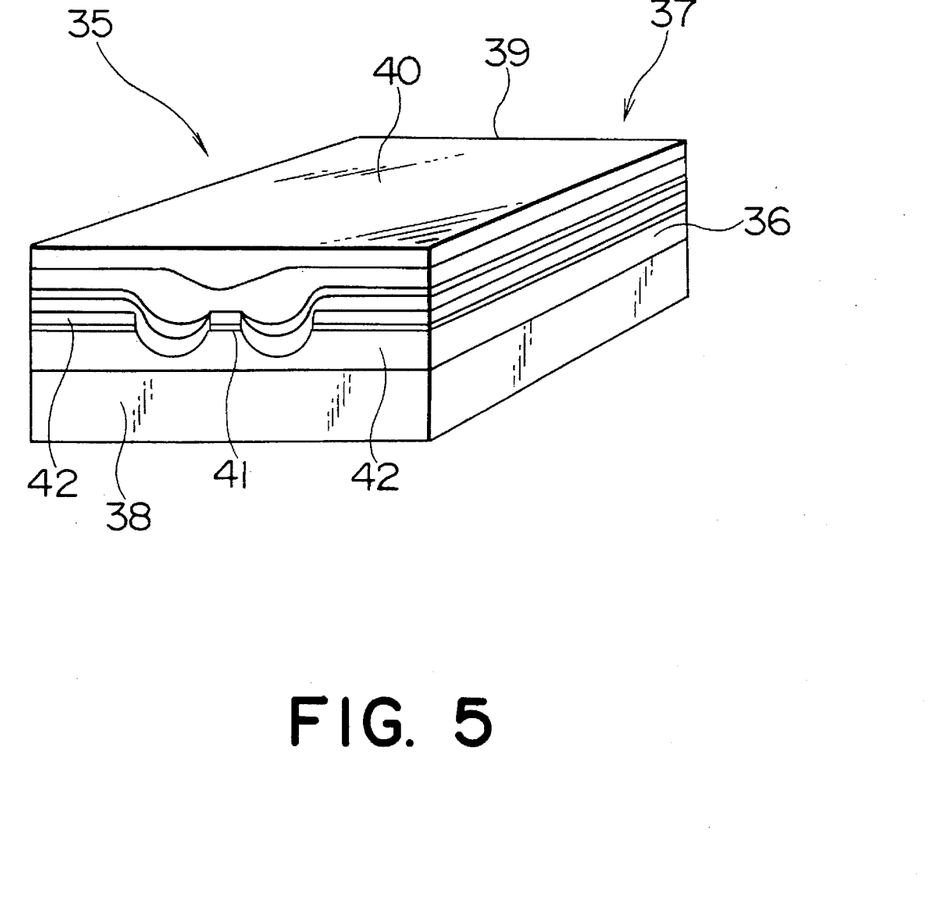
FIG. 5 is a perspective view of a semiconductor laser element according to a third embodiment of this invention.

Referring to FIGS. 5 through 8, a semiconductor laser element according to a third embodiment of this invention will now be described. In FIG. 5, the semiconductor laser element 35 comprises a semiconductor block 36 and a plurality of coating layers 37. The semiconductor block 36 has a first end surface 38 which defines a laser beam emitting surface, a second end surface 39 which is opposite to the first end surface 38, and a principal surface 40 contiguous to the first and the second end surfaces 38 and 39. The second end surface 39 is remote from the first end surface 38 by a predetermined distance shorter than 150 µm to provide an optical resonator therebetween. The plurality of coating layers 37 are coated on the second end surface 39 to provide a reflectively not lower than 90%.

Figure 7:
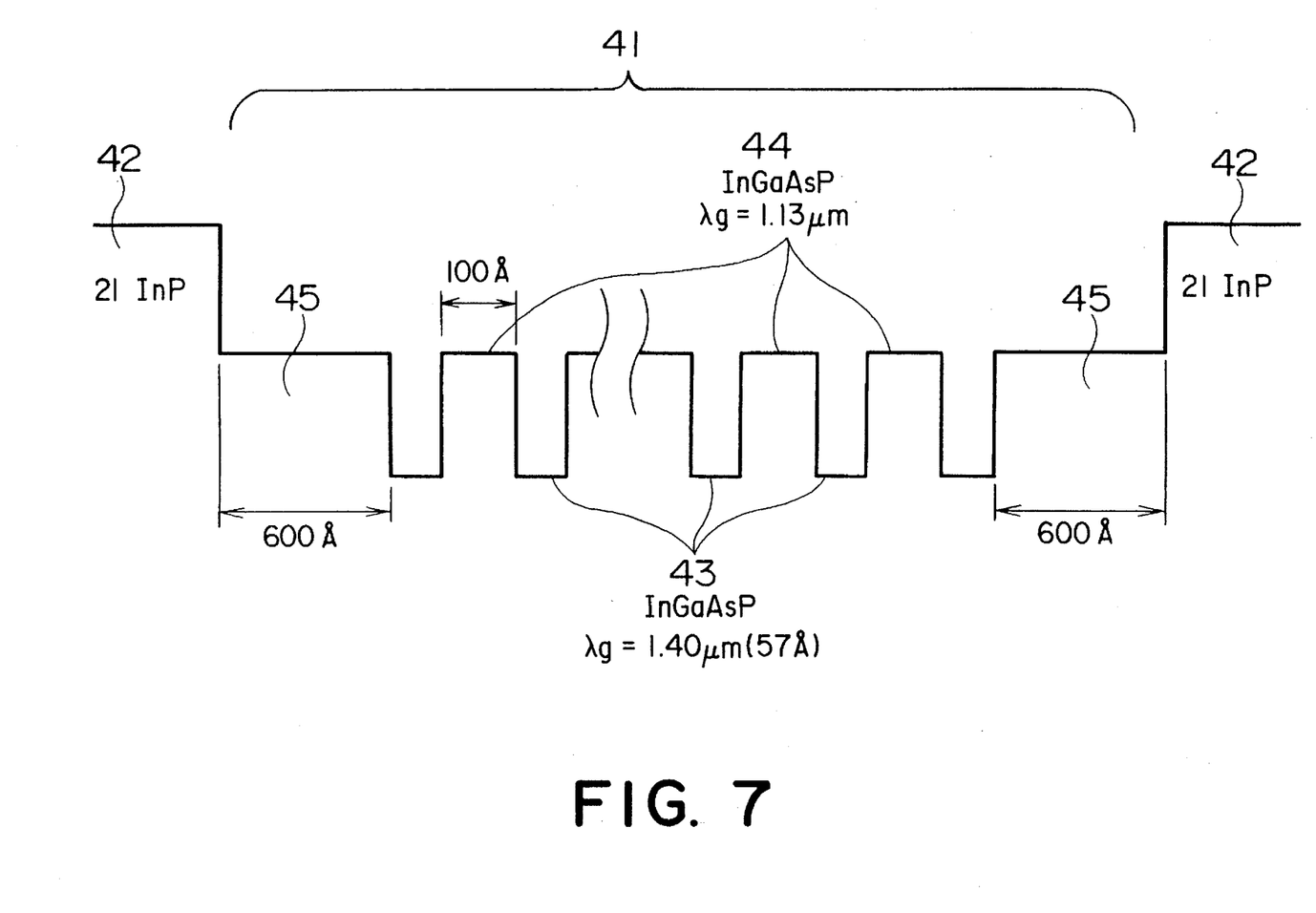
FIG. 7 is a band diagram of active layers of the semiconductor laser element according to the third embodiment of this invention.

The semiconductor laser element further comprises active layers 41, as symbolized in FIGS. 5 and 7, which are made of a material consisting of InGaAsP and are sandwiched by clad layers 42, 42 which are made of InP. The active layers 41 have multiple quantum well (MQW) structure.

As shown in FIG. 7, the active layers 41 include wells 43 and barriers 44. The wells 43 are made of InGaAsP lattice-matched with the clad layers 42 of InP and have a composition defined by a bandgap corresponding to a wavelength of 1.40 µm. On the other hand, the barriers 44 are made of InGaAsP lattice-matched with the clad layers 42 of InP and have a composition defined by a bandgap corresponding to a wavelength of 1.13 µm.

Specifically, the wells 43 are equal in number to seven. Each well is provided by a film having a thickness of 57 Å while each barrier is also provided by a film having a thickness of 100 Å. The MQW structure is sandwiched on both sides by guiding layers 45, 45 of InGaAsP having a composition defined by a bandgap corresponding to a wavelength of 1.13 µm. Actually, each guiding layer has a thickness of 600 Å. Thus, the MQW active layers 41 consist of seven 57 Å InGaAsP (λg=1.40 µm) wells, six 100 Å InGaAsP (λg=1.13 µm) barriers, and two 600 Å InGaAsP (λg=1.13 µm) guiding layers. The 57 Å InGaAsP (λg=1.40 µm) wells are separated by the 100 Å InGaAsP (λg=1.13 µm) barriers and the 600 Å InGaAsP (λg=1.13 µm) guiding layers.

According to the inventor's experimental studies, it has been found that a temperature characteristic can be favorably improved at a high temperature, such as 85° C., in the semiconductor laser element which generates a laser beam of a long wavelength band of, for example, 1.3 micron meters by rendering a distance between the light emitting surfaces, namely, the distance between the first and the second end surfaces equal to or shorter than 150 micron meters and by coating, on a selected one of the first and the second end surfaces, a high reflection layer which has a reflectivity not lower than 90%.

Now, an analysis will be made as regards the reasons why the temperature characteristic is improved by shortening the distance between the first and the second end surfaces and by selecting the reflectivity on one of the first and the second end surfaces. The distance between the first and the second end surfaces will be referred to as a resonator length hereinunder.

In order to extract a light output from a semiconductor laser element at a high efficiency, a threshold current should be optimally determined so that the resonator has an adequate resonator loss matched with an internal gain of the resonator. In other words, the light output can not be efficiently obtained when the resonator loss is excessively small or large in comparison with the internal gain.

From this fact, it is necessary that the resonator loss should be optimally selected so as to achieve high efficiency in the semiconductor laser element. Herein, the resonator loss is determined by an internal loss, a resonator length, and a reflectivity on an end surface. This shows that an optimum high efficiency can be achieved by selecting the resonator length and the reflectivity on the end surface condition, assuming that the internal loss is previously obtained. Internal loss is known as one of basical the fundamental parameters in the semiconductor laser element.

To this end, let calculations be at first made as regards the fundamental parameters, such as an internal loss, an internal quantum efficiency, a gain constant, and an initial current density. Hereby, it is possible to obtain a characteristic between a current and a light output, namely, a current to light output characteristic when the fundamental parameters can be calculated.

Taking the above into consideration, the device parameters have been calculated in connection with a wide variety of multi quantum well (MQW) laser elements which have been manufactured by the inventor and which have operated in the wavelength band of 1.3 microns. Subsequently, dependency of the threshold current and a differential quantum efficiency on the resonator length have been measured for such MQW laser elements to determine the fundamental parameters.

In the following table, there are shown the device parameters of one of the MQW lasers at temperatures 25° C. and 85° C.

TABLE

| DEVICE PARAMETERS | | | | | | | |
|---|---|---|---|---|---|---|---|
| 25° C. | | | | 85° C. | | | |
| $\alpha_1$ cm$^{-1}$ | $\eta_1$ | $\Gamma wGo$ cm$^{-1}$ | $Jo$ A/cm$^2$ | $\alpha_1$ cm$^{-1}$ | $\eta_1$ | $\Gamma wGo$ cm$^{-1}$ | $Jo$ A/cm$^2$ |
| 12.1 | 0.88 | 8.7 | 450 | 15.5 | 0.74 | 6.0 | 730 |

Figure 6:
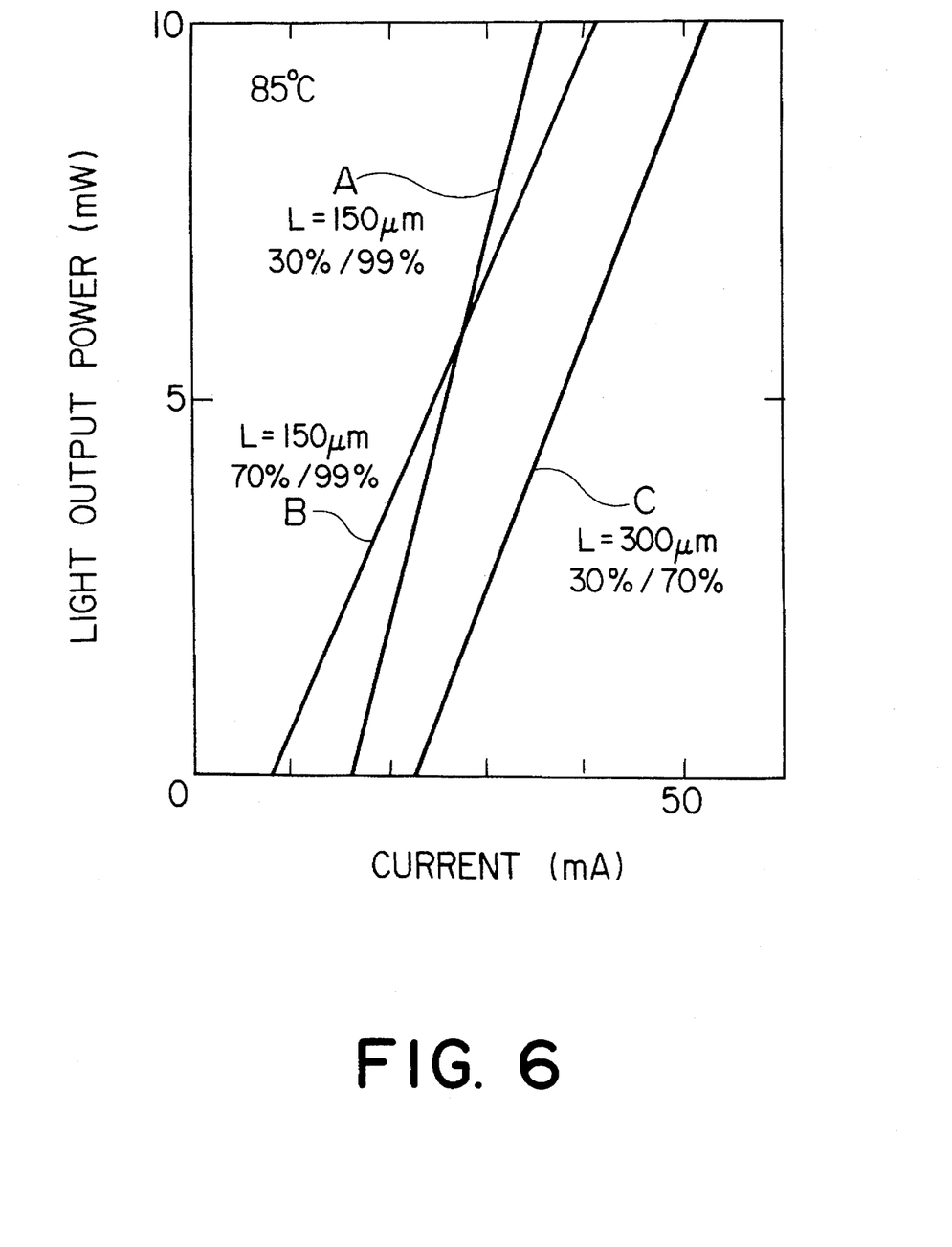
FIG. 6 is a graphical representation for use in describing a relationship between each current and light output power in a conventional semiconductor laser element as well as in a semiconductor laser element according to a third embodiment of this invention.

Referring to FIG. 6, description is made about a current (I) versus light output characteristic of the MQW lasers in 85° C. manufactured in the above-mentioned manner. In FIG. 6, a first straight line A, a second straight line B, and a third straight line C exemplify a relation of light output powers in response to currents in a first, second, and third MQW laser elements, respectively. The first MQW laser element has an optical resonator length of 150 µm. It also has 30% and 99% reflectivities in its first and second end surfaces, respectively. The second MQW laser element has 70% and 99% reflectivities in its first and second end surfaces, respectively. The third MQW laser element has the length of 300 µm and also has 30% and 70% reflectivities in its first and second end surfaces, respectively.

As represented clearly in FIG. 6, it is understood that a high-temperature characteristic of the laser is drastically improved both by making the length of an optical resonator equal to 150 µm and by depositing coating layers having a 99% reflectivity on the second end surface.

Besides, as to a composition of wells in the laser element, the applicant fabricated two types of the lasers, one of which has a composition of wells defined by a bandgap corresponding to a wavelength of 1.35 μm and another of which has a composition defined by a bandgap corresponding to a wavelength of 1.40 μm. Comparing the former with the latter, the latter is superior to the former in the aforesaid I-L characteristics at 85° C. In addition, as to the numbers of wells in the laser element, the applicant fabricated four types of the lasers, having seven wells, ten wells, eighteen wells, and twenty-two wells. The laser having seven wells can be operated by the lowest driving current of all types of the lasers.

In order to manufacture this element, an MQW wafer is, at first, fabricated by pressure-reduced metal organic vapor phase epitaxy (MOVPE) deposition. Several kinds of InP and InGaAsP layers are deposited on the MQW wafer by liquid phase epitaxy (LPE) deposition to form a double-channel planar buried hetero (DC-PBH) structure. As a result, the MQW wafer is buried in the DC-PBH structure.

Second, a mesa electrode layer is evaporated on a P-side surface of the DC-PBH structure by evaporation.

Third, the other side of the DC-PBH structure is polished to a thickness of about 150 μm. Then, an N-side electrode is also formed on the side directed downwards in FIG. 5.

Finally, the DC-PBH structure is cloven at a portion spaced apart from the first end surface 38 by approximately 150 μm. This means that the optical resonator provided therebetween comes to be about 150 μm long. The coating layers 37 consisting of seven layers are coated on the second end surface 39 to provide the high reflectivity. Each layer is composed of either $SiO_2$ or Si and has a thickness of $\lambda/4$ where $\lambda$ is a wavelength generated by the semiconductor laser element. Thereafter, the DC-PBH wafer is scribed or cut along the width direction into a plurality of the semiconductor laser elements 35.

Figure 8:
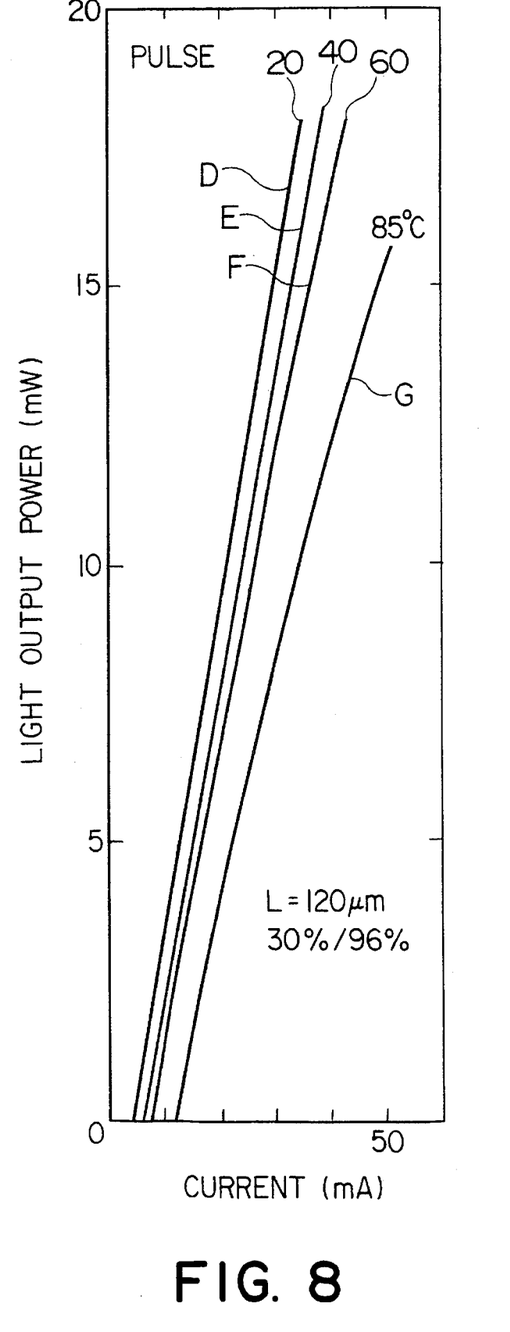
FIG. 8 is a graphical representation for use in describing a relationship between each current and light output power of the semiconductor laser element according to the third embodiment of this invention in various temperature conditions.

Referring to FIG. 8, description is provided for an I-L characteristic of a pulse of the MQW laser, which was investigated at various temperatures. The MQW laser has an optical resonator which is 120 μm long and also has 30% and 96% reflectivities in its first and second end surfaces, respectively. In FIG. 8, a first straight line D, a second straight line E, a third straight line F, and a fourth straight line G exemplify relationships between light output power and currents supplied to the MQW lasers at temperatures 20° C., 40° C., 60° C., and 85° C., respectively. In the temperature of 85° C., the straight line G shows that light output power is not smaller than 8 mW even when a driving current is as small as 30 mA. As represented in FIG. 8, it is understood that this semiconductor laser element has an excellent high-temperature characteristic.

While this invention has thus far been described in conjunction with several embodiments thereof, it will readily be possible for those skilled in the art to put this invention into practice in various other manners. For example, the feature of this invention which means that the semiconductor block 2 has a groove 7 is applicable to AlGaAs/GaAs and AlGaInP/GaAs lasers. Also, the active layers 41 may be made of a material consisting of InGaAs. Moreover, the active layers 41 may also have a bulk structure. Finally, although the semiconductor laser element according to the third embodiment of this invention comprises the semiconductor block 36 including no groove in the above description, it may have a semiconductor block including a groove into which an end portion of an optical fiber or waveguide can be fitted, like the first and the second embodiments of this invention.

What is claimed is:

1. A semiconductor laser element capable of being operated with a low driving current under a high temperature operating condition, comprising:

a semiconductor block having:
   a first end surface which defines a laser beam emitting surface;
   a second end surface which is opposite to said first end surface;
   a principal surface contiguous to said first and said second end surfaces;
   said second end surface being remote from said first end surface by a predetermined distance not longer than 150 μm to provide an optical resonator therebetween;
   a plurality of coating layers which are coated on said second end surface to provide a reflectivity not lower than 90%; and active layers each of which is made of a material selected from a group consisting of InGaAs and InGaAsP, said active layers being interposed between cladding layers;
   wherein said active layers have a multiple quantum well (MQW) structure; and
   wherein said active layers comprise:
      at least five wells which are made of InGaAsP lattice-matched with InP and having a composition defined by a bandgap corresponding to a wavelength between 1.35 μm and 1.45 μm, and
      barriers which are interposed between said wells and which are made of InGaAsP lattice-matched with InP and having a composition defined by a bandgap corresponding to a wavelength between 1.05 μm and 1.20 μm;
   said semiconductor laser element producing a light output greater than 5 mW in response to an input current not larger than 30 mA at 85° C.

2. A semiconductor laser element as claimed in claim 1, wherein a number of said wells is seven.

3. A semiconductor laser element, comprising:

a semiconductor block including a laser beam emitting portion and having:
   a first end surface;
   a second end surface opposite to said first end surface;
   a principal surface contiguous to said first and said second end surfaces;
   an internal end surface obtained by forming a U-shaped groove from said principal surface into said semiconductor block, said internal end surface providing a laser beam emitting surface for an optical resonator formed between said internal end surface and said second end surface; and
   a plurality of active layers interposed between cladding layers and having a multiple quantum well structure;
   wherein said active layers comprise:
      at least five wells which are made of InGaAsP lattice-matched with InP and which have a composition defined by a bandgap corresponding to a wavelength between 1.35 μm and 1.45 μm and
      barriers which are made of InGaAsP lattice-matched with InP and which have a composition defined by a bandgap corresponding to a wavelength between 1.05 μm and 1.20 μm,
   wherein said second end surface is remote from said first end surface by a predetermined distance of substantially at least 250 μm, and
   wherein said internal end surface is remote from said second end surface by a predetermined distance not longer than 150 μm.

4. A semiconductor laser element as claimed in claim 3, further comprising a plurality of coating layers which are coated on said second end surface to provide a reflectivity not lower than 70%.

5. A semiconductor laser element as claimed in claim 3, further comprising a plurality of coating layers which are coated on said second end surface to provide a reflectivity not lower than 90%.

6. A semiconductor laser element as claimed in claim 3, wherein a number of said wells is seven.

7. A semiconductor laser element, comprising:
a semiconductor block including a laser beam emitting portion and having:
a first end surface,
a second end surface opposite to said first end surface;
a principal surface contiguous to said first and said second end surfaces;
an internal end surface obtained by forming a rectangular groove from said principal surface into said semiconductor block, said internal surface providing a laser beam emitting surface for an optical resonator formed between said internal end surface and said second end surface, and
a plurality of active layers interposed between cladding layers and having a multiple quantum well structure;
wherein said active layers comprise:
at least five wells which are made of InGaAsP lattice-matched with InP and which have a composition defined by a bandgap corresponding to a wavelength between 1.35 µm and 1.45 µm and
barriers which are made of InGaAsP lattice-matched with InP and which have a composition defined by a bandgap corresponding to a wavelength between 1.05 µm and 1.20 µm,
wherein said second end surface is remote from said first end surface by a predetermined distance of substantially at least 250 µm, and
wherein said internal end surface is remote from said second end surface by a predetermined distance not longer than 150 µm.

8. A semiconductor laser element as claimed in claim 7, further comprising a plurality of coating layers which are coated on said second end surface to provide a reflectivity not lower than 70%.

9. A semiconductor laser element as claimed in claim 7, further comprising a plurality of coating layers which are coated on said second end surface to provide a reflectivity not lower than 90%.

10. A semiconductor laser element as claimed in claim 7, wherein a number of said wells is seven.

11. A semiconductor laser device comprising:
an optical fiber which has an end portion;
a circuit board having a board surface;
a semiconductor block including a laser beam emitting portion and which is mounted on said board surface and which has:
a first end surface;
a second end surface opposite to said first end surface;
a principal surface contiguous to said first and said second end surfaces;
an internal end surface obtained by forming a U-shaped groove from said principal surface into said semiconductor block, said internal surface providing a laser beam emitting surface for an optical resonator formed between said internal end surface and said second end surface; and
a plurality of active layers interposed between cladding layers and having a multiple quantum well structure;
wherein said active layers comprise:
at least five wells which are made of InGaAsP lattice-matched with InP and which have a composition defined by a bandgap corresponding to a wavelength between 1.35 µm and 1.45 µm and
barriers which are made of InGaAsP lattice-matched with InP and which have a composition defined by a bandgap corresponding to a wavelength between 1.05 µm and 1.20 µm,
wherein said second end surface is remote from said first end surface by a predetermined distance of substantially at least 250 µm,
wherein said internal end surface is remote from said second end surface by a predetermined distance not longer than 150 µm, and
wherein said end portion of said optical fiber is fitted into said U-shaped groove to be optically coupled to said laser beam emitting surface.

12. A semiconductor laser device comprising;
a circuit board having a board surface;
an optical waveguide which has an end portion and which is formed on said board surface;
a semiconductor block including a laser beam emitting portion and which is mounted on said board surface and which has:
a first end surface;
a second end surface opposite to said first end surface;
a principal surface contiguous to said first and said second end surfaces;
an internal end surface obtained by forming a rectangular groove from said principal surface into said semiconductor block, said internal surface providing a laser beam emitting surface for an optical resonator formed between said internal end surface and said second end surface; and
a plurality of active layers interposed between cladding layers and having a multiple quantum well structure;
wherein said active layers comprise:
at least five wells which are made of InGaAsP lattice-matched with InP and which have a composition defined by a bandgap corresponding to a wavelength between 1.35 µm and 1.45 µm and
barriers which are made of InGaAsP lattice-matched with InP and which have a composition defined by a bandgap corresponding to a wavelength between 1.05 µm and 1.20 µm,
wherein said second end surface is remote from said first end surface by a predetermined distance of substantially at least 250 µm,
wherein said internal end surface is remote from said second end surface by a predetermined distance not longer than 150 µm, and
wherein said end portion of said optical waveguide is fitted into said rectangular groove to be optically connected to said laser beam emitting surface.

13. A semiconductor laser element, comprising:
a semiconductor block which has a length not shorter than 250 micrometers and which includes a laser beam emitting portion, said semiconductor block comprising:
a first end surface;
a second end surface opposite to said first end surface and remote from said first end surface by a predetermined distance of substantially at least 250 µm;
a principal surface contiguous to said first and said second end surfaces;
an internal end surface obtained by forming a U-shaped groove from said principal surface into said semiconductor block, said internal end surface providing a laser beam emitting surface for an optical resonator formed between said internal end surface and said second end surface and having a length not longer than 150 micrometers;

a plurality of coating layers which are coated on said second end surface to provide a reflectivity not lower than 90%; and active layers interposed between cladding layers and having a multiple quantum well structure;

wherein said active layers comprise:
wells which are made of InGaAsP lattice-matched with InP and which have a composition defined by a bandgap corresponding to a wavelength between 1.35 µm and 1.45 µm and barriers which are made of InGaAsP lattice-matched with InP and which have a composition defined by a bandgap corresponding to a wavelength between 1.05 µm and 1.20 µm, and wherein said semiconductor laser element is arranged to produce a light output greater than 5 mW in response to an input current not larger than 30 mA at 85° C.

14. A semiconductor laser element, comprising:

a semiconductor block which has a length not shorter than 250 micrometers and which includes a laser beam emitting portion, said semiconductor block comprising:
a first end surface;
a second end surface opposite to said first end surface and remote from said first end surface by a predetermined distance of substantially at least 250 µm;
a principal surface contiguous to said first and said second end surfaces;

an internal end surface obtained by forming a rectangularly shaped groove from said principal surface into said semiconductor block, said internal end surface providing a laser beam emitting surface for an optical resonator formed between said internal end surface and said second end surface and having a length not longer than 150 micrometers;

a plurality of coating layers which are coated on said second end surface to provide a reflectivity not lower than 90%; and active layers interposed between cladding layers and having a multiple quantum well structure;

wherein said active layers comprise:
wells which are made of InGaAsP lattice-matched with InP and which have a composition defined by a bandgap corresponding to a wavelength between 1.35 µm and 1.45 µm and barriers which are made of InGaAsP lattice-matched with InP and which have a composition defined by a bandgap corresponding to a wavelength between 1.05 µm and 1.20 µm, and wherein said semiconductor laser element is arranged to produce a light output greater than 5 mW in response to an input current not larger than 30 mA at 85° C.

* * * * *